US010005100B2

(12) United States Patent
Kwak et al.

(10) Patent No.: US 10,005,100 B2
(45) Date of Patent: Jun. 26, 2018

(54) METHOD FOR FORMING FINE PATTERNS

(71) Applicant: Samsung Display Co., Ltd., Yongin-si (KR)

(72) Inventors: Eun Ae Kwak, Gunpo-si (KR); Min Hyuck Kang, Seoul (KR); Gug Rae Jo, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days. days.

(21) Appl. No.: 15/348,305

(22) Filed: Nov. 10, 2016

(65) Prior Publication Data

US 2017/0348729 A1 Dec. 7, 2017

(30) Foreign Application Priority Data

Jun. 7, 2016 (KR) .................. 10-2016-0070404

(51) Int. Cl.
*B05D 3/00* (2006.01)
*B05D 1/00* (2006.01)
*B05D 3/12* (2006.01)
*G02B 5/30* (2006.01)
*G02F 1/1335* (2006.01)
*G02F 1/1368* (2006.01)
(Continued)

(52) U.S. Cl.
CPC .............. *B05D 3/007* (2013.01); *B05D 1/005* (2013.01); *B05D 3/12* (2013.01); *G02B 5/3058* (2013.01); *G02F 1/1368* (2013.01); *G02F 1/133528* (2013.01); *G02F 2001/133548* (2013.01); *H01L 27/1222* (2013.01); *H01L 29/78678* (2013.01)

(58) Field of Classification Search
CPC .......... B05D 3/007; B05D 1/005; B05D 3/12; G02B 5/3058; H01L 29/78678; H01L 27/1222; G02F 1/1368; G02F 2001/133548; G02F 1/133528
See application file for complete search history.

(56) References Cited

U.S. PATENT DOCUMENTS

2007/0212494 A1  9/2007  Xu et al.
2008/0061214 A1  3/2008  Lee et al.
(Continued)

FOREIGN PATENT DOCUMENTS

KR  10-2008-0024364  3/2008
KR  10-2009-0128473  12/2009
(Continued)

OTHER PUBLICATIONS

Haeshin Lee et al., "A reversible wet/dry adhesive inspired by mussels and geckos", Nature Publishing Group 2007, vol. 448, Jul. 19, 2007, pp. 338-342.

(Continued)

*Primary Examiner* — Nadine Norton
*Assistant Examiner* — Mahmoud Dahimene
(74) *Attorney, Agent, or Firm* — H.C. Park & Associates, PLC

(57) ABSTRACT

A method of forming fine patterns includes the steps of forming a conductive layer on a base part, forming a sacrificial layer including an adhesive material on the conductive layer, the adhesive material including a catechol group, forming resist patterns on the sacrificial layer, and forming fine patterns by patterning the conductive layer using the resist patterns as a mask.

12 Claims, 16 Drawing Sheets

(51) Int. Cl.
*H01L 27/12* (2006.01)
*H01L 29/786* (2006.01)

(56) References Cited

U.S. PATENT DOCUMENTS

| | | | |
|---|---|---|---|
| 2010/0151685 A1* | 6/2010 | Yasuda | H01L 21/02079 438/703 |
| 2011/0024950 A1* | 2/2011 | Kruglick | B82Y 10/00 264/496 |
| 2012/0168065 A1 | 7/2012 | Kaida et al. | |
| 2013/0084352 A1 | 4/2013 | Suzuki et al. | |
| 2013/0153534 A1 | 6/2013 | Resnick et al. | |
| 2014/0336040 A1* | 11/2014 | Yan | C08G 73/0688 502/159 |
| 2015/0209846 A1* | 7/2015 | Aizanberg | A61L 29/06 428/142 |

FOREIGN PATENT DOCUMENTS

| | | |
|---|---|---|
| KR | 10-2011-0070271 | 6/2011 |
| KR | 10-2012-0102210 | 9/2012 |
| KR | 10-2012-0106923 | 9/2012 |
| KR | 10-2013-0071426 | 6/2013 |
| KR | 10-2014-0117425 | 10/2014 |
| KR | 10-2015-0030982 | 3/2015 |
| KR | 10-2015-0109514 | 10/2015 |

OTHER PUBLICATIONS

Bong Hoon Kim et al., "Mussel-Inspired Block Copolymer Lithography for Low Surface Energy Materials of Teflon, Graphene, and Gold", Advanced Materials, Adv. Mater. 2011, vol. 23, pp. 5618-5622.

Haeshin Lee et al., "Mussle-Inspired Surface Chemistry for Multifunctional Coatings", NIH Public Access, Author Manuscript, Science Oct. 19, 2007, vol. 313(5849): 426-430, 10 pages.

* cited by examiner

METHOD FOR FORMING FINE PATTERNS

CROSS-REFERENCE TO RELATED APPLICATION

This application claims priority from and the benefit of Korean Patent Application No. 10-2016-0070404 filed on Jun. 7, 2016, which is hereby incorporated by reference for all purposes as if fully set forth herein.

BACKGROUND

Field

Exemplary embodiments relate to a method of forming fine patterns.

Discussion of the Background

A polarizer is an optical element that converts unpolarized or arbitrarily polarized electromagnetic waves into electromagnetic waves having a desired polarization. For example, a polyvinyl alcohol (PVA) polarizer may be used in a thin-film transistor-liquid crystal display (TFT-LCD) as an absorptive polarizer. The PVA polarizer may be provided on each of a upper glass and a lower glass of a panel, and may pass or block light emitted from a backlight unit (BLU) for panel driving.

Unlike the absorptive polarizer that absorbs S-polarized waves and passes P-polarized waves, a metal wire grid polarizer (WGP) is a reflective polarizer that reflects the S-polarized waves and passes the P-polarized waves. Therefore, if the metal WGP is applied to a display device such as a TFT-LCD, the S-polarized waves reflected off the surface of the metal WGP may be recycled, thereby improving brightness and reducing the cost of a light source.

As display devices become larger in size, a metal WGP that is free from defects and that is applicable to a large-area may be required. Accordingly, there is a need for a method of forming fine patterns over a large area to manufacture a master mold or a metal WGP, and a method of forming fine patterns that may easily correct defects.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a method of forming fine patterns that easily corrects defects.

Exemplary embodiments also provide a method of forming fine patterns over a large area.

Additional aspects will be set forth in the detailed description which follows, and, in part, will be apparent from the disclosure, or may be learned by practice of the inventive concept.

An exemplary embodiment discloses a method of forming fine patterns including the steps of forming a conductive layer on a base part, forming a sacrificial layer including an adhesive material on the conductive layer, the adhesive material including a catechol group, forming resist patterns on the sacrificial layer, and forming fine patterns by patterning the conductive layer using the resist patterns as a mask.

An exemplary embodiment also discloses a method of forming fine patterns including the steps of preparing a base part including a first area, a second area, and a boundary area between the first area and the second area, forming a first sacrificial layer including a first adhesive material on the first area, the second area, and the boundary area, the first adhesive material including a catechol group, forming first resist patterns on the first sacrificial layer, forming a first cover pattern on the first sacrificial layer to cover a portion of the first resist patterns overlapping the boundary area, the first cover pattern not covering the first resist patterns overlapping the first area, forming first fine patterns by patterning the first area using the first resist patterns and the first cover pattern as a mask, separating the first sacrificial layer from the base part, and forming second fine patterns on the second area of the base part.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
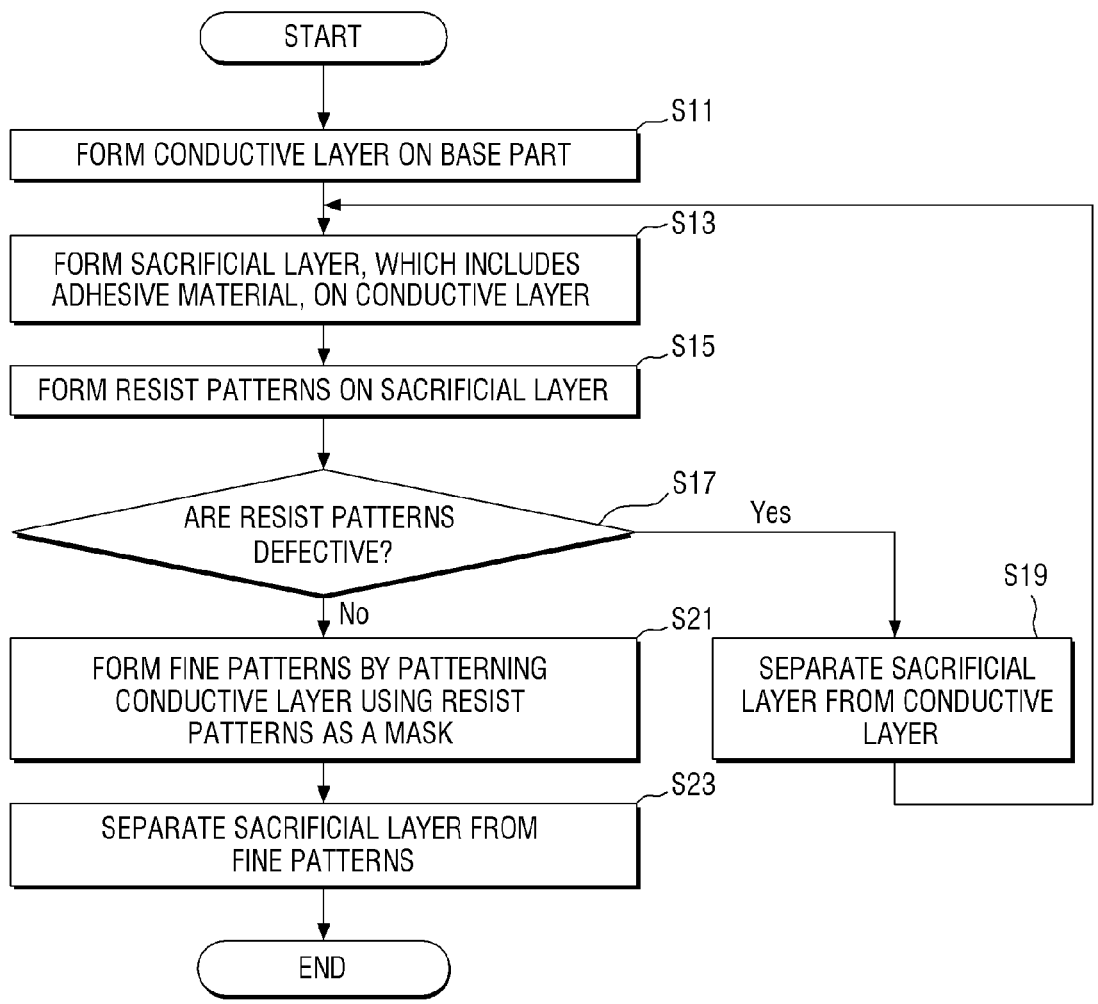
FIG. 1 is a flowchart illustrating a method of forming fine patterns according to an exemplary embodiment of the present invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a flowchart illustrating a method of forming fine patterns according to an exemplary embodiment. Referring to FIG. 1, the method of forming fine patterns according to an exemplary embodiment may include the steps of forming a conductive layer on a base part (operation S11), forming a sacrificial layer, which includes an adhesive material including a catechol group, on the conductive layer (operation S13), forming resist patterns on the sacrificial layer (operation S15), determining whether the resist patterns are defective (operation S17), and separating the sacrificial layer from the conductive layer if any one of the resist patterns are defective (operation S19). The method of forming fine patterns according to an exemplary embodiment may further include the steps of forming fine patterns by patterning the conductive layer using the resist patterns as a mask, if the resist patterns are not defective (operation S21) and separating the sacrificial layer from the fine patterns (operation S23).

The method of forming fine patterns according to an exemplary embodiment will be described in more detail with reference FIGS. 2 through 12.

FIGS. 2 through 12 are schematic cross-sectional views illustrating operations of the method of FIG. 1.

Referring to FIGS. 1 through 4, forming the conductive layer on the base part (operation S11) and forming the sacrificial layer, which includes the adhesive material including the catechol group, on the conductive layer (operation S13) may be performed as the following.

Figure 2:
FIG. 2, FIG. 3, FIG. 4, FIG. 5, FIG. 6, FIG. 7, FIG. 8, FIG. 9, FIG. 10, FIG. 11, and FIG. 12 are schematic cross-sectional views illustrating operations of the method of FIG. 1.

First, referring to FIG. 2, a base part 110 is prepared. The base part 110 may include any material that may transmit visible light. For example, the base part 110 may include various polymers such as, but not limited to, glass, quartz, acrylic, triacetylcellulose (TAC), cyclic olefin copolymer (COC), cyclic olefin polymer (COP), polycarbonate (PC), polyethylene naphthalate (PET), polyimide (PI), polyethylene naphthalate (PEN), polyether sulfone (PES), and polyarylate (PAR). The base part 110 may also include an optical film material having flexibility.

Figure 3:
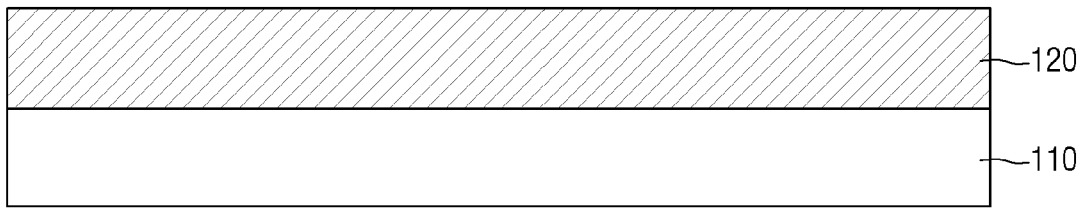

Referring to FIG. 3, a conductive layer 120 is formed on the base part 110. The conductive layer 120 may include a conductive material having high light reflectivity. For example, the conductive layer 120 may include at least one of aluminium (Al), chrome (Cr), silver (Ag), copper (Cu), nickel (Ni), titanium (Ti), cobalt (Co), and molybdenum (Mo), or an alloy thereof. The conductive layer 120 may include aluminium, which has relatively high reflectivity among the metals above. The conductive layer 120 may have a single layer or two or more layers structure.

Figure 4:
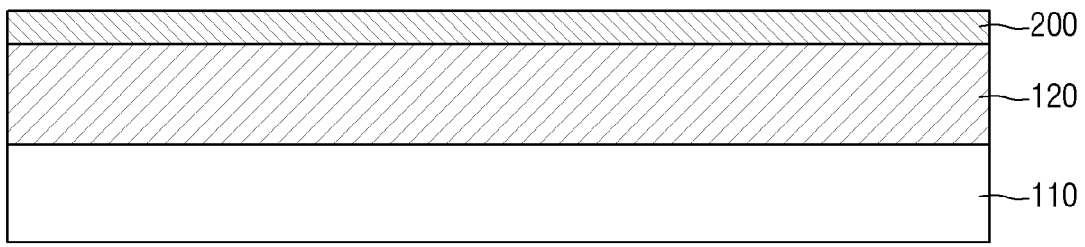

Referring to FIG. 4, a sacrificial layer 200 including an adhesive material, which includes a catechol group, is formed on the conductive layer 120.

The sacrificial layer 200 may be formed by spin-coating a solution dissolved with an adhesive material including a catechol group, and then baking the solution by heating. The sacrificial layer 200 may alternatively formed by bar-coating the solution dissolved with the adhesive material including the catechol group on the conductive layer 120. The sacrificial layer 200 may be formed by various other methods known in the art.

The adhesive material including the catechol group in the sacrificial layer 200 may be a polymer that has adhesive characteristics of a mussel. For example, the adhesive material including the catechol group may be polydopamine (pDA) or polynorepinephrine (pNor). The adhesive material including the catechol group, such as polydopamine or polynorepinephrine, may have high adhesive strength on surfaces of most metals, non-metals, organic polymers, inorganic materials, etc. Therefore, the sacrificial layer 200 including the adhesive material (e.g., polydopamine or polynorepinephrine) that includes the catechol group may adhere to the conductive layer 120, regardless of characteristics of the conductive layer 120. Furthermore, the adhesive material including the catechol group in the sacrificial layer 200 may also prevent a resist layer 300 or resist patterns 310, which will be described later, from being separated from the conductive layer 120, such that fine patterns may be formed thereon more stably. In addition, when any one of the resist patterns 310 is defective, as the sacrificial layer 200 and other layers disposed on the sacrificial layer 200 may be easily separated from the conductive layer 120, a rework process may be performed easily. This will be described in more detail later.

Figure 5:
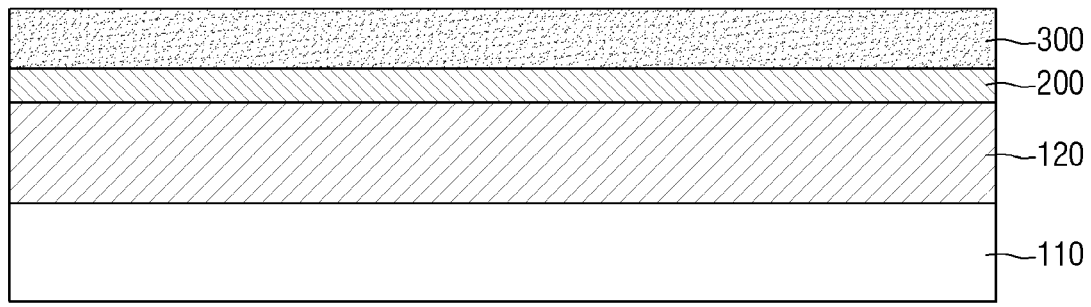
Figure 6:
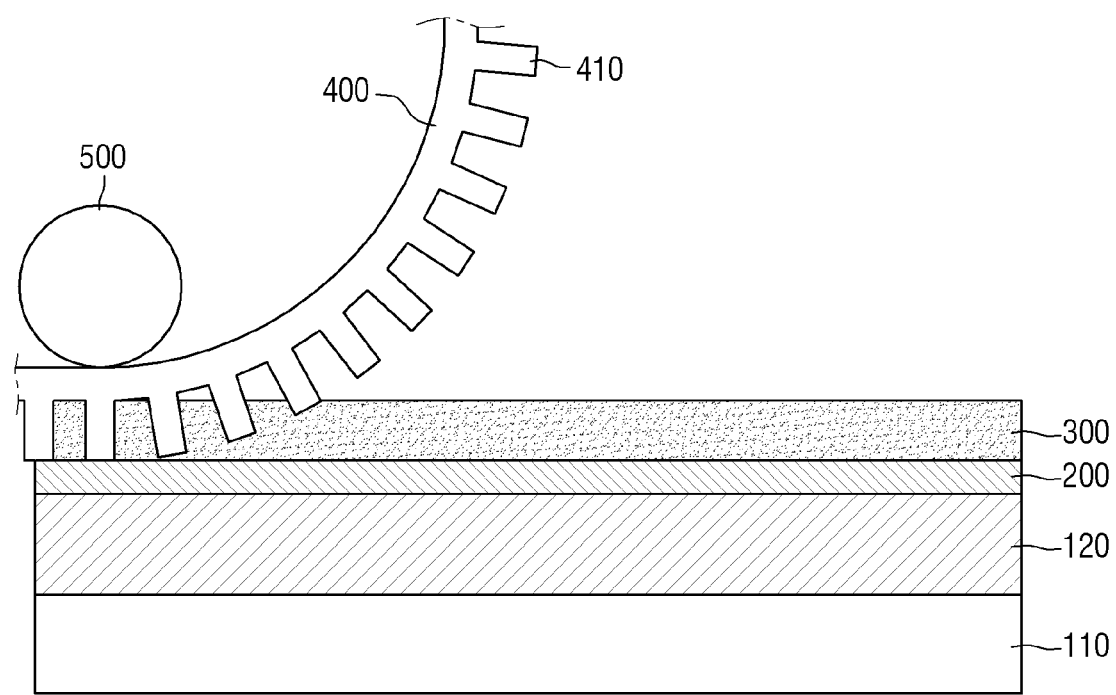

Referring to FIGS. 1, 5 and 6, forming the resist patterns on the sacrificial layer (operation S15) may be performed as the following.

Referring to FIG. 5, the resist layer 300 is formed on the sacrificial layer 200.

The resist layer 300 may be formed by coating resin on the sacrificial layer 200. The resin may be photocurable resin, such as acrylic resin, styrene resin, olefin resin, polycarbonate resin, polyester resin, epoxy resin, silicon resin, etc. The resin layer 300 may alternatively be thermoplastic resin, which undergoes plastic deformation when heated over a predetermined temperature.

Referring to FIG. 6, a mold 400 having transfer patterns 410 is prepared. The shape of the transfer patterns 410 of the mold 400 are formed on the resist layer 300 by pressing the mold 400 towards the resist layer 300. Then, the resist layer 300 is cured. The resist layer 300 may be cured by ultraviolet (UV) irradiation when the resist layer 300 is photocurable resin. The resist layer 300 may also be cured by heating the resist layer 300 using a heat source when the resist layer 300 is thermoplastic resin. That is, the transfer patterns 410 of the mold 400 are transferred onto the resist layer 300 by an imprinting process.

When the mold 400 includes a flexible material, the mold 400 may be pressed towards the resist layer 300 using a roller 500, as illustrated in FIG. 6. When the mold 400 alternatively includes a rigid material, however, the roller 500 may be omitted. More particularly, the mold 400 including a rigid material may be pressed down towards the resist layer 300, thereby transferring the shape of the transfer patterns 410 of the mold 400 onto the resist layer 300.

Figure 7:
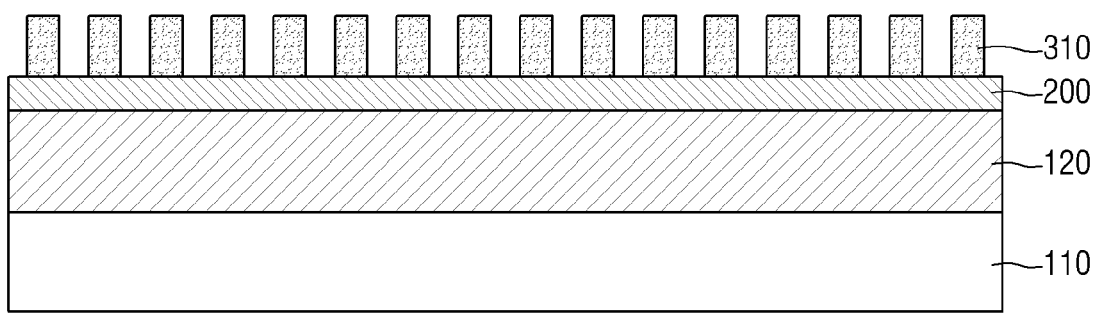

Next, the mold 400 is separated from the resist layer 300 to produce a plurality of resist patterns 310 as illustrated in FIG. 7. The resist patterns 310 are formed on the sacrificial layer 200, and the sacrificial layer 200 is exposed through each space between the resist patterns 310. Alternatively, a bottom portion that connects the resist patterns 310 may exist on the entire upper surface of the sacrificial layer 200.

In this case, the bottom portion may be removed by, for example, an etching process or an ashing process.

Next, the step of determining whether the resist patterns 310 are defective (operation S17) may be performed. Defects in the resist patterns 310 may be determined by analyzing mura revealed by illuminating the resist patterns 310, or by taking a scanning electron microscope (SEM) picture of the resist patterns 310 and interpreting the SEM picture. It is contemplated that, however, various methods known in the art may be utilized to identify defects in the resist patterns 310.

Figure 8:
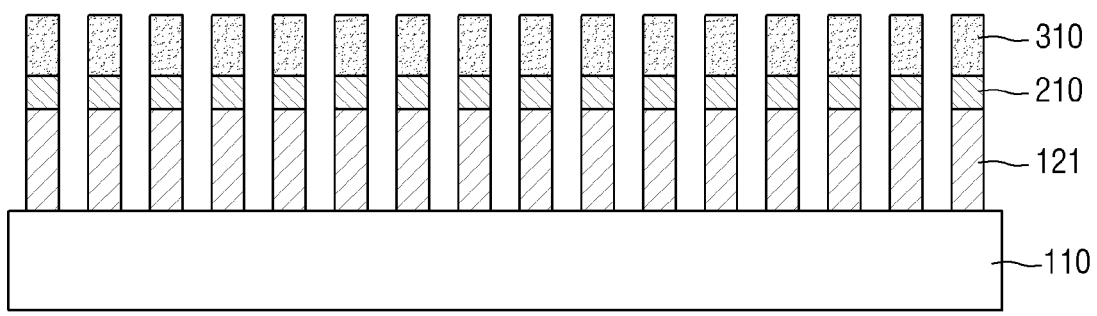

Referring to FIGS. 1, 7 and 8, forming the fine patterns 121 by patterning the conductive layer 120 using the resist patterns 310 as the mask, if the resist patterns 310 are not defective, (operation S21) may be performed as the following.

More specifically, the sacrificial layer 200 and the conductive layer 120 are patterned by using the resist patterns 310 as a mask. In this manner, fine patterns 121 that are formed by patterning the conductive layer 120 may be disposed under the resist patterns 310, and the patterned sacrificial layer 210 may remain between the resist patterns 310 and the fine patterns 121. The sacrificial layer 200 and the conductive layer 120 may be patterned by a dry-etching process using an etching gas. The etching gas may include at least one of $BCl_3$, $SiCl_4$, $Cl_2$, HBr, $SF_6$, $CF_4$, $C_4F_8$, $CH_4$, $CHF_3$, $NF_3$, CFCs (chlorofluorocarbons), $H_2$, and $O_2$, and may further include inert gas including at least one of $N_2$, Ar, and He.

Figure 9:
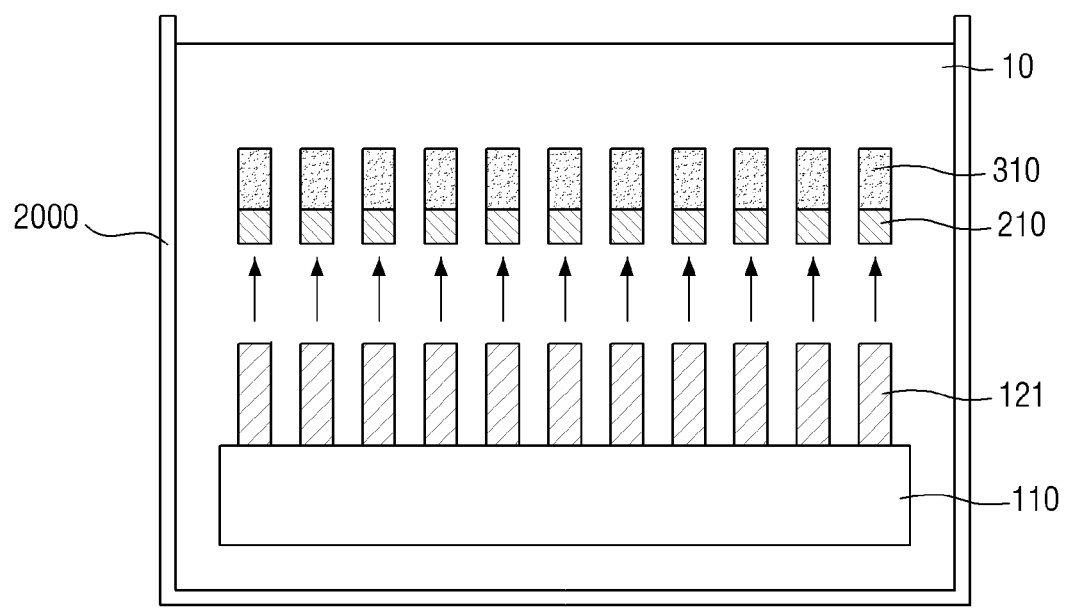

Referring to FIGS. 1 and 9, separating the sacrificial layer from the fine patterns (operation S23) may be performed as the following.

The patterned sacrificial layer 210 may be separated from the fine patterns 121 by treating the patterned sacrificial layer 210 with a base or hydrogen peroxide. When the patterned sacrificial layer 210 is separated from the fine patterns 121, the resist patterns 310 disposed on the sacrificial layer 210 may also be separated from the fine patterns 121. Referring to FIG. 9, the patterned sacrificial layer 210 may be immersed in a bath 2000 that includes a basic solution or a hydrogen peroxide solution 10. In this manner, the patterned sacrificial layer 210 and the resist patterns 310 on the patterned sacrificial layer 210 may be separated from the fine patterns 121. The adhesive strength of the adhesive material including the catechol group, which is included in the patterned sacrificial layer 210, is removed in the basic solution or the hydrogen peroxide solution 10. Therefore, the patterned sacrificial layer 210 may be easily separated from the fine patterns 121. For example, the basic solution may have a pH of 8.0 to 8.5, and include a tetramethylammonium hydroxide (TMAH) aqueous solution or a potassium hydroxide (KOH) aqueous solution.

Figure 10:
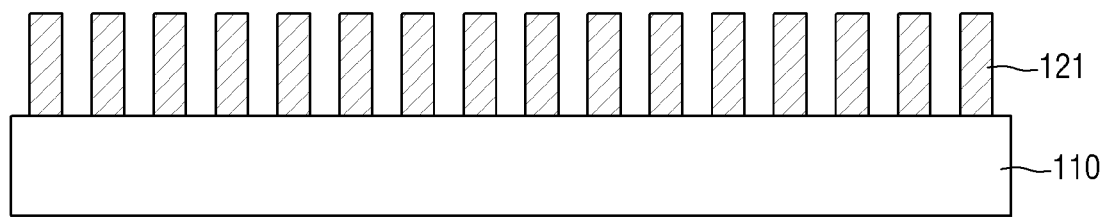

When the sacrificial layer 210 and the resist patterns 310 are removed as described above, a structure including a plurality of fine patterns 121 may be obtained as illustrated in FIG. 10. The structure including the fine patterns 121 may be used as a wire grid polarizer.

Figure 11:
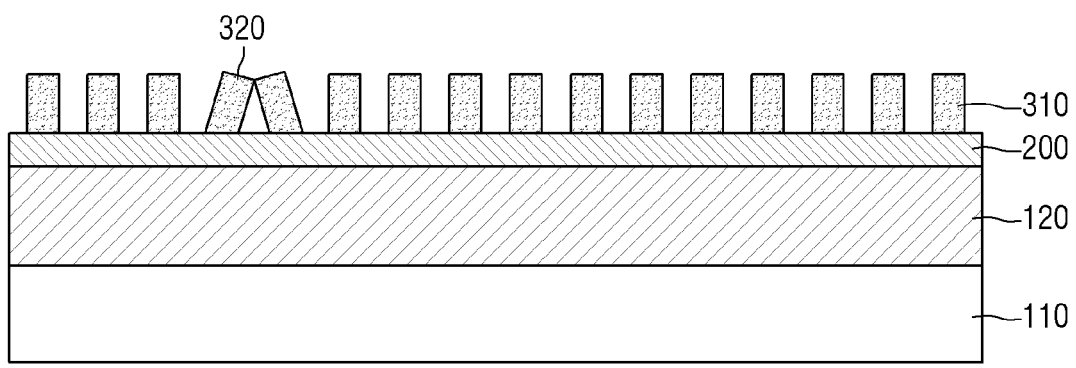
Figure 12:
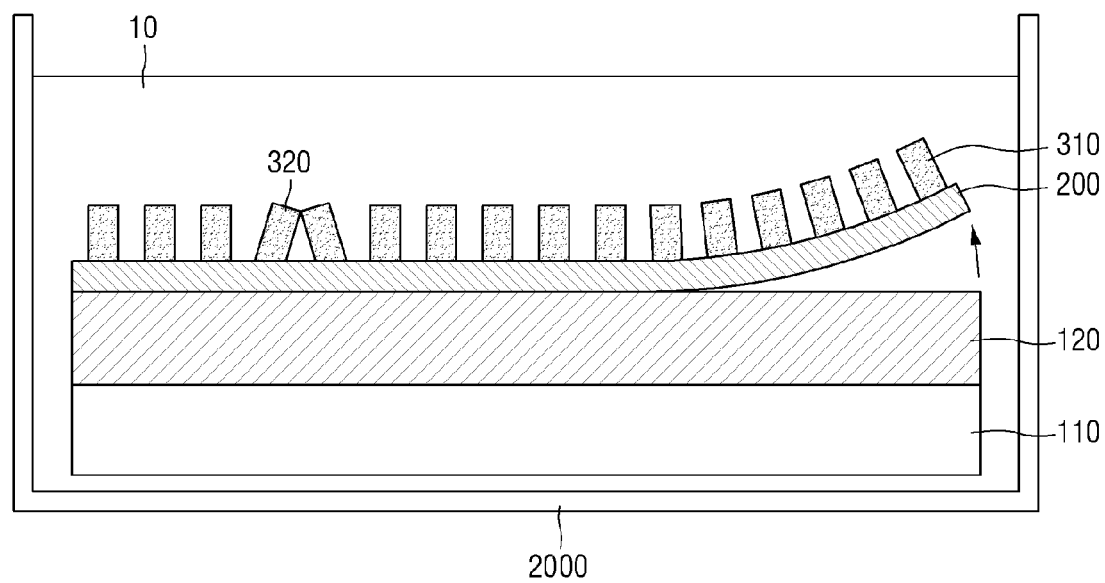

Referring to FIGS. 1, 11 and 12, separating the sacrificial layer from the conductive layer if any one of the resist patterns are defective (operation S19) may be performed as the following.

Referring to FIG. 11, defective patterns 320 can be formed in the process of forming the resist patterns 310. For example, some of the transfer patterns 410 of the mold 400 may be transferred in unwanted shapes due to the adhesion between the mold 400 and the resist layer 300 during the process of transferring the transfer patterns 410 of the mold 400, or the mold 400 may be pressed unevenly towards the resist layer 300. When the defective patterns 320 exist, fine patterns finally formed by patterning the conductive layer 120 may also be defective.

When the defective patterns 320 are formed, the method of forming fine patterns according to an exemplary embodiment may include separating the sacrificial layer 200 from the conductive layer 120, such that defects may be reworked. As illustrated in FIG. 11, the sacrificial layer 200 may be separated from the conductive layer 120 by treating the sacrificial layer 200 with a base or hydrogen peroxide. More particularly, the sacrificial layer 200 may be immersed in the bath 2000 that includes the basic solution or the hydrogen peroxide solution 10. Accordingly, the resist patterns 310 and the defective patterns 320 on the sacrificial layer 200 may be separated from the conductive layer 120, together with the sacrificial layer 200.

The adhesive strength of the adhesive material including the catechol group, which is included in the sacrificial layer 210, is removed in the basic solution or the hydrogen peroxide solution 10 as described above. In this manner, the sacrificial layer 210 may be easily separated from the conductive layer 120. For example, the basic solution may have a pH of 8.0 to 8.5, and include a tetramethylammonium hydroxide (TMAH) aqueous solution or a potassium hydroxide (KOH) aqueous solution as described above.

After the sacrificial layer 200 is removed, operations S13, S15, and S17 described above may be repeated. When the defective patterns 320 are formed a number of times, the above operations may be repeated a number of times.

According to an exemplary embodiment, when any one of resist patterns 310 are defective, the resist patterns 310 may be easily separated from a conductive layer 120 through removing the sacrificial layer 200. Accordingly, a rework process may be easily performed. In addition, since the sacrificial layer 200 includes an adhesive material including a catechol group, the sacrificial layer 200 may be easily separated from the conductive layer 120 by treating the sacrificial layer 200 with a base or hydrogen peroxide 10, which also makes the rework process easy. Further, process efficiency may be improved as the conductive layer 120 may be reused. Moreover, the method of forming fine patterns may be employed to provide a fine pattern structure (e.g., a wire grid polarizer) with minimum defects.

Figure 13:
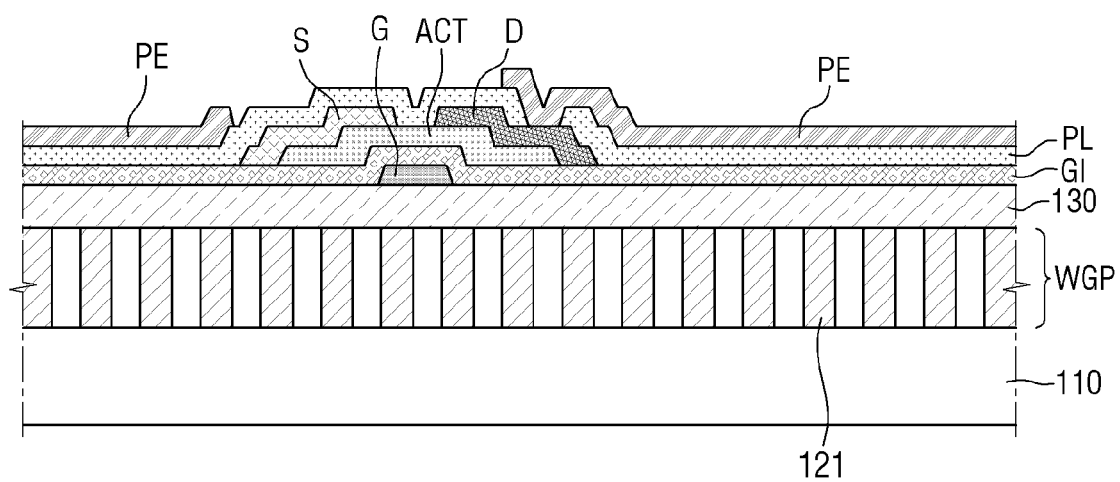
FIG. 13 is a schematic cross-sectional view of a display substrate including a wire grid polarizer manufactured using the method of forming fine patterns of FIG. 1.

FIG. 13 is a schematic cross-sectional view of a display substrate including a wire grid polarizer manufactured using the method of forming fine patterns of FIG. 1.

Referring to FIG. 13, the display substrate may be a thin-film transistor (TFT) substrate. The display substrate will hereinafter be described in more detail, and any redundant description of elements described above will be given briefly or omitted.

A wire grid polarizer WGP may be disposed on a base part 110. More particularly, the wire grid polarizer WGP may be an in-cell type that is formed integrally with the display substrate.

The wire grid polarizer WGP may polarize light transmitted through the base part 110, and include a plurality of fine patterns 121. The fine patterns 121 may include a conductive material as described above with respect to a conductive layer 120 of FIG. 3. For example, the conductive material may include at least one metal of aluminium (Al), chrome (Cr), silver (Ag), copper (Cu), nickel (Ni), titanium (Ti), cobalt (Co), and molybdenum (Mo), or an alloy thereof.

The fine patterns 121 may be arranged regularly and parallel to each other along a direction. The fine patterns 121 may be arranged with a period shorter than a wavelength of visible light. For example, the fine patterns 121 may be arranged with a period of approximately 400 nm or less. In particular, the arrangement period of the fine patterns 121 may be approximately 200 nm or less, for example, 100 nm or less.

Light that transmits through the base part 110 proceeds while oscillating disorderly in directions horizontal and vertical to its proceeding direction. Therefore, of the light incident upon the fine patterns 121, a portion of the light oscillating in a direction perpendicular to an extending direction of the fine patterns 121 passes through the wire grid polarizer WGP, and the remaining portion of the light is reflected by the fine patterns 121. More particularly, only P-polarized light transmits through the wire grid polarizer WGP, and S-polarized light is reflected by the wire grid polarizer WGP. In this manner, only the P-polarized light penetrates the wire grid polarizer WGP. The S-polarized light reflected by the wire grid polarizer WGP may be scattered by a light guide plate (LGP) included in a backlight unit (not illustrated) disposed under the wire grid polarizer WGP. The polarization of the reflected S-polarized light may be offset, and light may be reflected back to the wire grid polarizer by a reflective plate included in the backlight unit. This process may be repeated. Accordingly, light efficiency of a display device may be improved.

A base insulating layer 130 may be disposed on the wire grid polarizer WGP. The base insulating layer 130 may insulate the wire grid polarizer WGP from an element disposed thereon, and planarize an upper surface of the wire grid polarizer WGP. The base insulating layer 130 may include an insulating material, for example, at least one of $SiO_x$, $SiN_x$, SiON, and SiOC.

A gate electrode G may be disposed on the base insulating layer 130, and a gate insulating layer GI may be disposed on the gate electrode G and the base insulating layer 130.

A semiconductor layer ACT may be disposed on the gate insulating layer GI, and at least a part of the semiconductor layer ACT may overlap the gate electrode G. A source electrode S and a drain electrode D may be disposed on the gate insulating layer GI, and separated from each other on the semiconductor layer ACT.

A passivation layer PL may be disposed on the gate insulating layer GI, the source electrode S, the semiconductor layer ACT and the drain electrode D.

A pixel electrode PE may be disposed on the passivation layer PL and may be physically and electrically connected to the drain electrode D via a contact hole formed in the passivation layer PL.

The display substrate may be applied to any one of a twisted nematic (TN) display panel, a vertical alignment (VA) display panel, a patterned vertical alignment (PVA) display panel, an in-plane switching (IPS) display panel, a fringe-field switching (FFS) display panel, and a plane-to-line switching (PLS) display panel.

Figure 14:
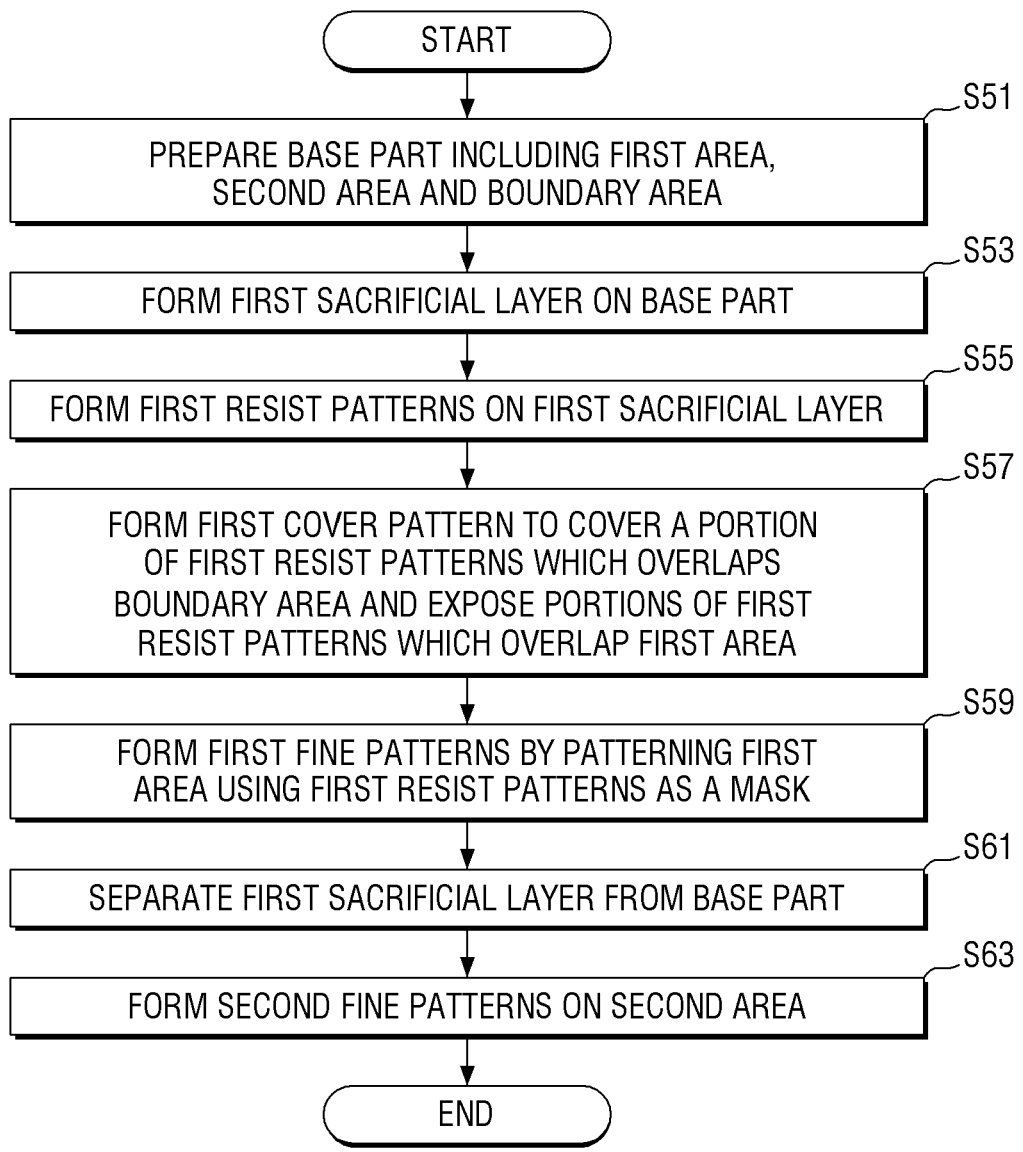
FIG. 14 is a flowchart illustrating a method of forming fine patterns according to an exemplary embodiment of the present invention.

FIG. 14 is a flowchart illustrating a method of forming fine patterns according to an exemplary embodiment. Referring to FIG. 14, the method of forming fine patterns according to an exemplary embodiment may include the steps of preparing a base part having a first area, a second area, and a boundary area between the first area and the second area (operation S51), forming a first sacrificial layer including a first adhesive material including a catechol group on the first area, the second area, and the boundary area of the base part (operation S53), forming first resist patterns on the first sacrificial layer (operation S55), forming a first cover pattern on the first sacrificial layer to cover portions of the first resist patterns disposed on the boundary area and the second area and expose portions of the first resist patterns disposed on the first area (operation S57), forming first fine patterns by patterning the first area by using the first resist patterns and the first cover pattern as a mask (operation S59), separating the first sacrificial layer from the base part (operation S61), and forming second fine patterns on the second area (operation S63).

The method of forming fine patterns according to an exemplary embodiment will be described in more detail with reference to FIGS. 15 through 28.

FIGS. 15 through 28 are schematic cross-sectional views illustrating operations of the method of FIG. 14.

Referring to FIGS. 14 through 19, preparing the base part having the first area, the second area, and the boundary area between the first area and the second area (operation S51), forming the first sacrificial layer including the first adhesive material including the catechol group on the first area, the second area, and the boundary area of the base part (operation S53), forming the first resist patterns on the first sacrificial layer (operation S55), forming the first cover pattern on the first sacrificial layer to cover the portions of the first resist patterns disposed on the boundary area and the second area and expose the portions of the first resist patterns disposed on the first area (operation S57) may be performed as the following.

Figure 15:
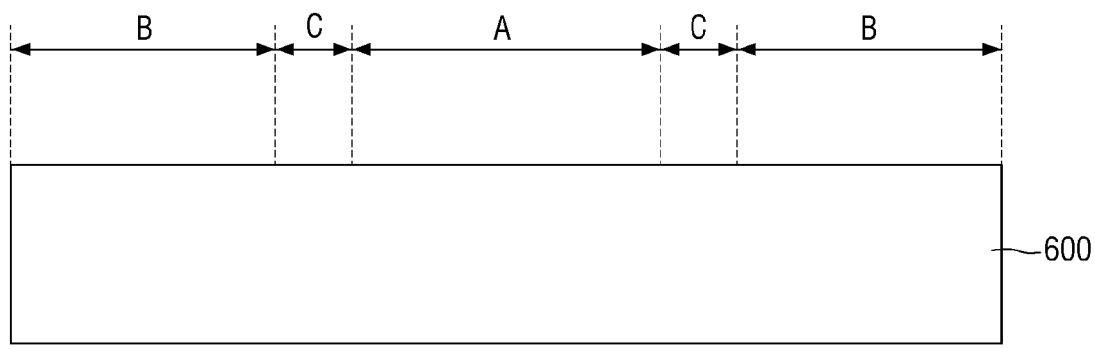
FIG. 15, FIG. 16, FIG. 17, FIG. 18, FIG. 19, FIG. 20, FIG. 21, FIG. 22, FIG. 23, FIG. 24, FIG. 25, FIG. 26, FIG. 27, and FIG. 28 are schematic cross-sectional views illustrating operations of the method of FIG. 14.

First, referring to FIG. 15, a base part 600 is prepared. The base part 600 may include a first area A, a second area B, and a boundary area C between the first area A and the second area B. The first area A may be an area on which first fine patterns are to be formed, and the second area B may be an area on which second fine patterns are to be formed.

When an object to be manufactured is a master mold, the base part 600 may include an inorganic material, such as silicon nitride or silicon oxide, an organic material such as epoxy resin, or quartz. When an object to be manufactured is a wire grid polarizer, the base part 600 may include a conductive material such as metal. It is contemplated that, however, material included in the base part 600 may vary according to the object to be manufactured using the method of forming fine patterns according to exemplary embodiments.

Figure 16:
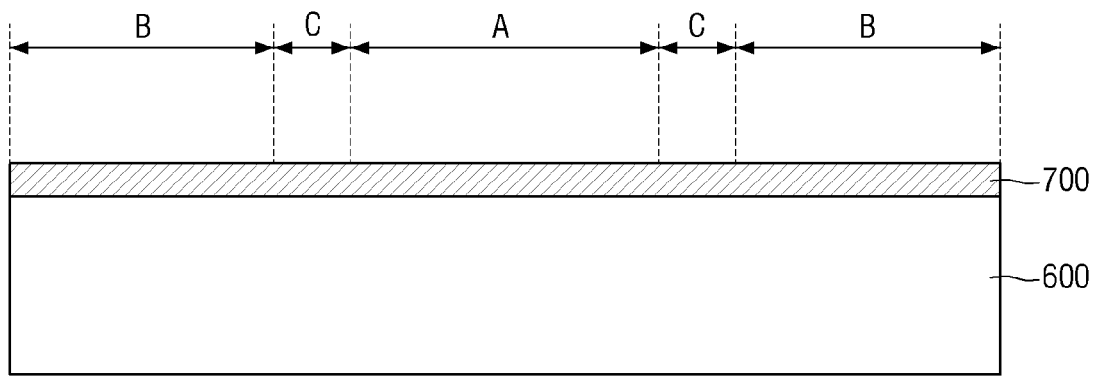

Referring to FIG. 16, a first sacrificial layer 700 is formed on the first area A, the second area B, and the boundary area C of the base part 600.

The first sacrificial layer 700 may include an adhesive material including a catechol group. For example, the adhesive material including the catechol group may be polydopamine (pDA) or polynorepinephrine (pNor).

Figure 17:
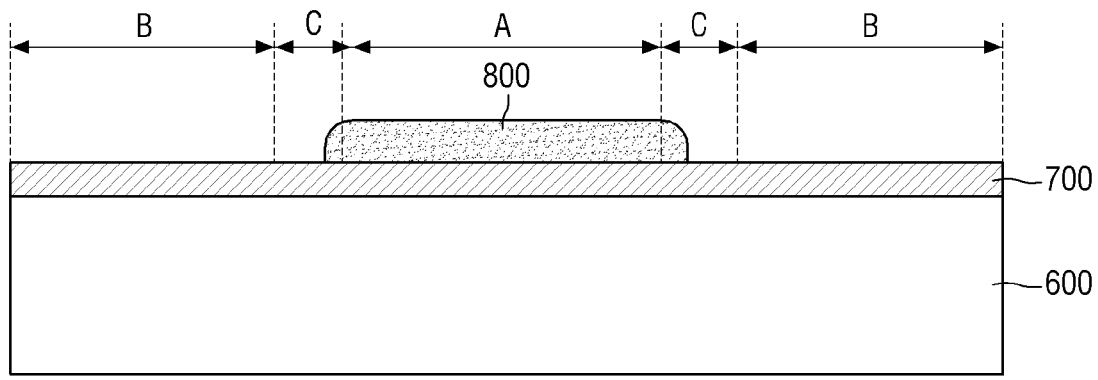

Referring to FIG. 17, a first resist layer 800 is formed on the first sacrificial layer 700. The first resist layer 800 may be formed to overlap the first area A as illustrated in FIG. 17, and may further overlap the boundary area C in consideration of margins. FIG. 17 illustrates that the first resist layer 800 overlaps the boundary area C, but does not overlap the second area B. It is contemplated that, however, the first resist layer 800 may be formed to overlap not only the first area A and the boundary area C, but also the second area B. The first resist layer 800 may include photocurable resin or thermoplastic resin.

Figure 18:
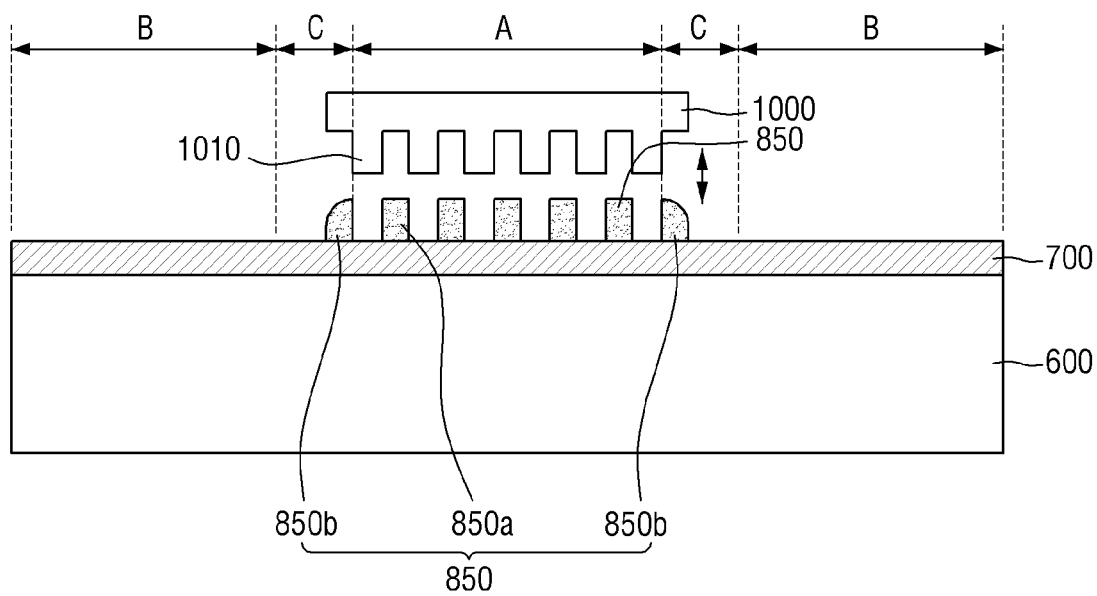

Referring to FIG. 18, a mold 1000 having transfer patterns 1010 is prepared. The shape of the transfer patterns 1010 of the mold 1000 are formed on the first resist layer 800 by an imprinting process, thereby forming first resist patterns 850. A detailed description of the imprinting process is identical or substantially similar described above, and thus, repeated descriptions thereof will be omitted. As described above, the first resist layer 800 may be formed to overlap not only the first area A but also the boundary area C in consideration of margins. Accordingly, the first resist patterns 850 may include first portions 850a overlapping the first area A and a second portion 850b overlapping the boundary area C.

Figure 19:
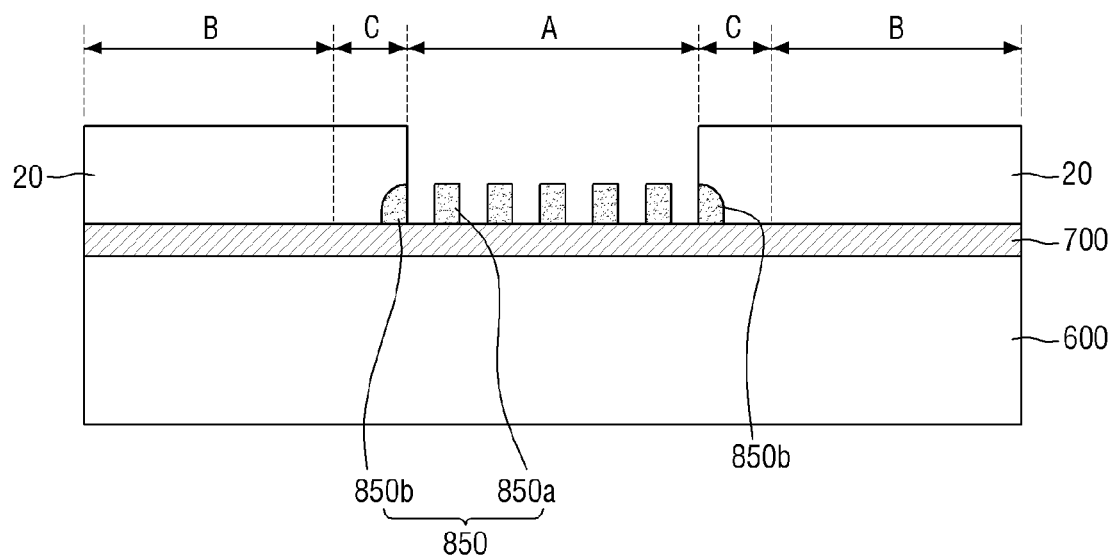

Referring to FIG. 19, a first cover pattern 20 is formed on the first sacrificial layer 700 to cover a portion of the first resist patterns 850. The first cover pattern 20 may be formed by coating a photoresist on the first sacrificial layer 700 to cover the first resist patterns 850, and exposing and developing the photoresist.

The first cover pattern 20 may cover the second portion 850b of the first resist patterns 850, which overlaps the boundary area C, and may not cover the first portions 850a of the first resist patterns 850, which overlap the first area A. In addition, the first cover pattern 20 may also cover a portion of the first sacrificial layer 700 overlapping the second area B.

Figure 20:
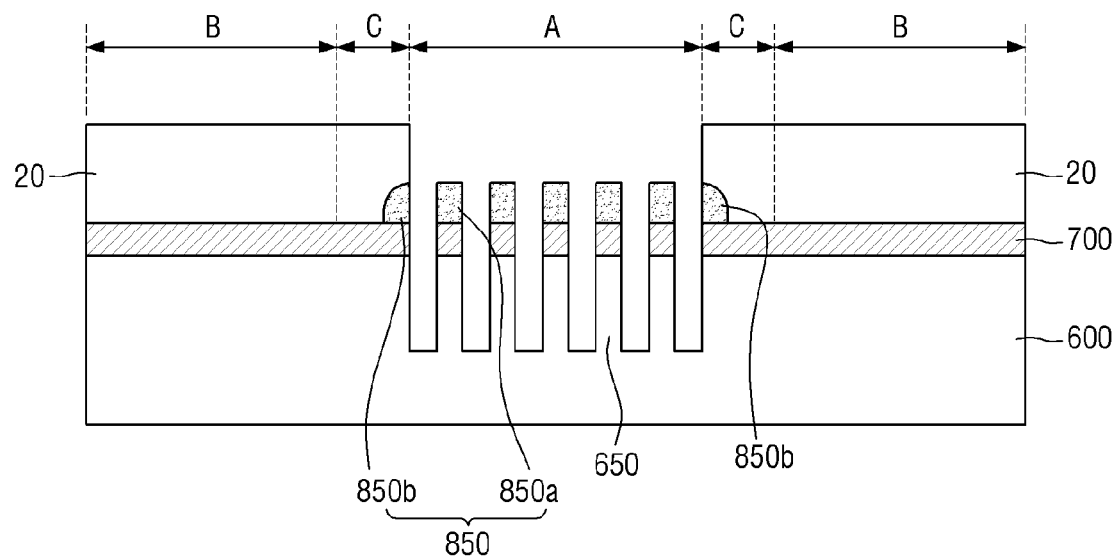
Figure 22:
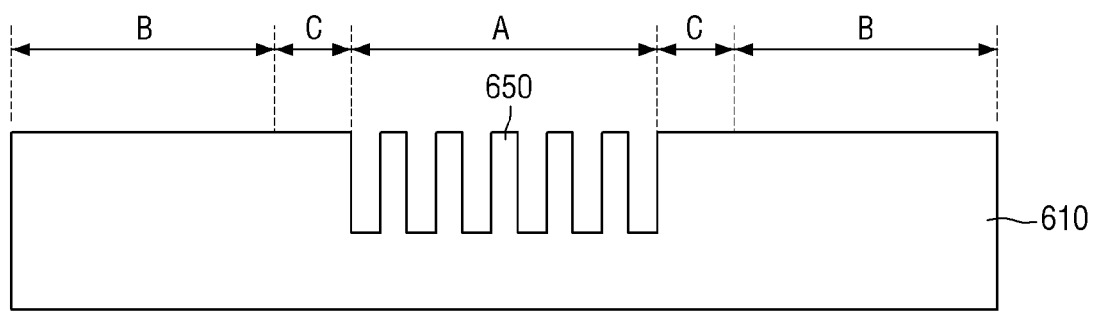

Referring to FIGS. 14, 20, and 22, forming the first fine patterns by patterning the first area using the first resist patterns and the first cover pattern as the mask (operation S59) and separating the first sacrificial layer from the base part (operation S61) may be performed as the following.

Referring to FIG. 20, the base part 600 is patterned by using the first resist patterns 850 and the first cover pattern 20 as a mask. More specifically, the first sacrificial layer 700 and the base part 600 are patterned by using the first resist patterns 850 as a mask. As a result, first fine patterns 650 formed by patterning the first area A of the base part 600 may be disposed under the first resist patterns 850. The boundary area C and the second area B of the base part 600 that are covered by the first cover pattern 20 may not be patterned. In addition, the first sacrificial layer 700 may remain between the first resist patterns 850 and the first fine patterns 650, and between the first cover pattern 20 and the base part 600. The first area A of the base part 600 may be patterned by a dry-etching process using an etching gas. The etching gas may be substantially similar to those described above, and thus, a repeated description thereof will be omitted.

Figure 21:
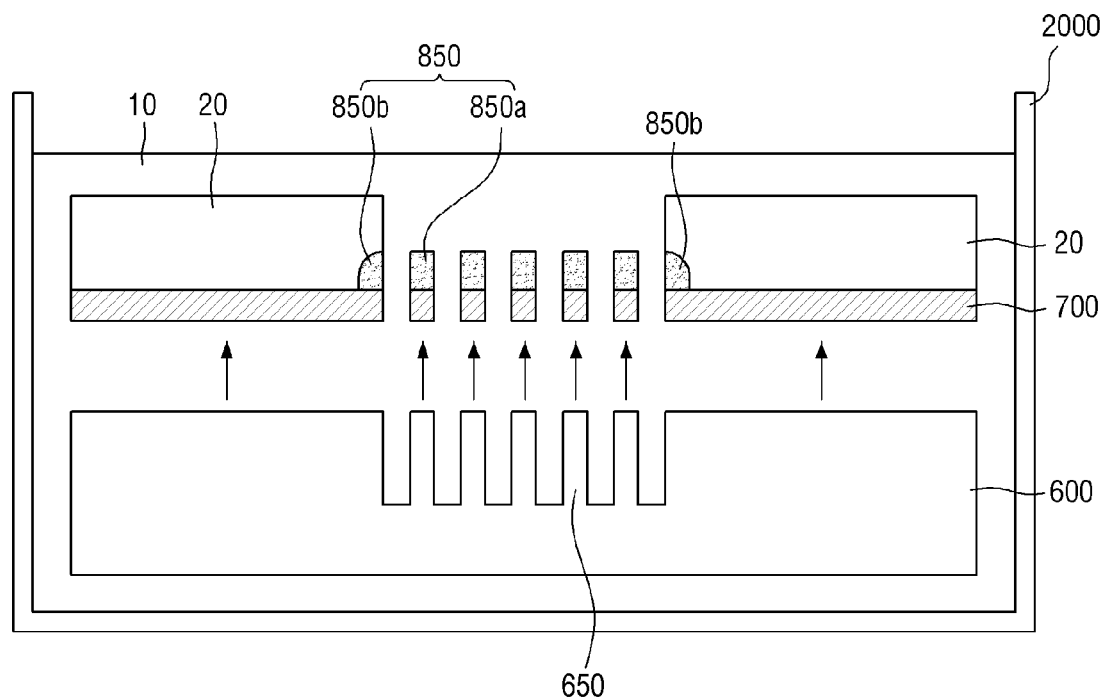

Referring to FIG. 21, the first sacrificial layer 700 may be separated from the base part 600 by treating the first sacrificial layer 700 with a base or hydrogen peroxide. When the first sacrificial layer 700 is separated from the base part 600, the first resist patterns 850 and the first cover pattern 20 disposed on the first sacrificial layer 700 may also be separated from the base part 600. For example, the first sacrificial layer 700 may be immersed in a bath 2000 that includes a basic solution or a hydrogen peroxide solution 10. Then, the adhesive strength of the adhesive material including the catechol group, which is included in in the first sacrificial layer 700, may be removed. Accordingly, the first sacrificial layer 700 may be easily separated from the base part 600. The basic solution may include a tetramethylammonium hydroxide (TMAH) aqueous solution or a potassium hydroxide (KOH) aqueous solution, as described above.

While the first portions 850a of the first resist patterns 850 are not covered by the first cover pattern 20, the second portion 850b is covered by the first cover pattern 20. Therefore, it may be difficult to remove the second portion 850b by using a process such as an ashing process, as compared to the first portions 850a. If the base part 600 is patterned using the unremoved second portion 850b as a mask, a defective fine pattern may be formed in the base part 600. Therefore, since it may be difficult to form a pattern in an area including the second portion 850b, a width of the boundary area C between the first area A and the second area B may generally be increased.

According to an exemplary embodiment, however, the first portions 850a of the first resist patterns 850 as well as the second portion 850b may be easily separated from the base part 600 by separating the first sacrificial layer 700 from the base part 600. Therefore, the width of the boundary area C between the first area A and the second area B may be relatively reduced, thereby reducing a stitch width of a fine pattern structure which will be described later. In addition, formation of a defective fine pattern due to the remaining second portion 850b may be prevented.

When the first sacrificial layer 700 is separated from the base part 600 together with the first resist patterns 850 and the first cover pattern 20 as described above, the base part 600 having a plurality of first fine patterns 650 may be obtained as illustrated in FIG. 22.

Referring to FIGS. 14 and 23 through 28, forming the second fine patterns on the second area (operation S63) may be performed as the following.

Figure 23:
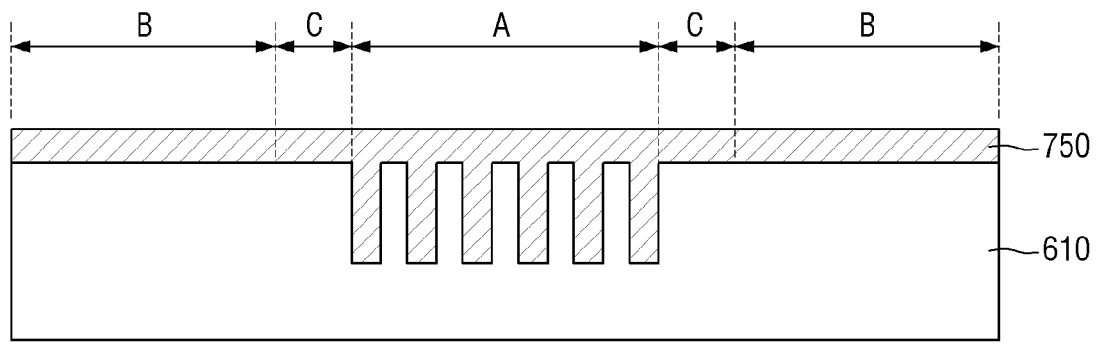

Referring to FIG. 23, a second sacrificial layer 750 is formed on the base part 600 having the first fine patterns 650. The second sacrificial layer 750 may be formed on the first area A, the second area B, and the boundary area C of the base part 600, and cover the first fine patterns 650. The second sacrificial layer 750 may include an adhesive material including a catechol group. The adhesive material including the catechol group may be polydopamine (pDA) or polynorepinephrine (pNor). According to an exemplary embodiment, the second sacrificial layer 750 and the first sacrificial layer 700 may include the same material.

Figure 24:
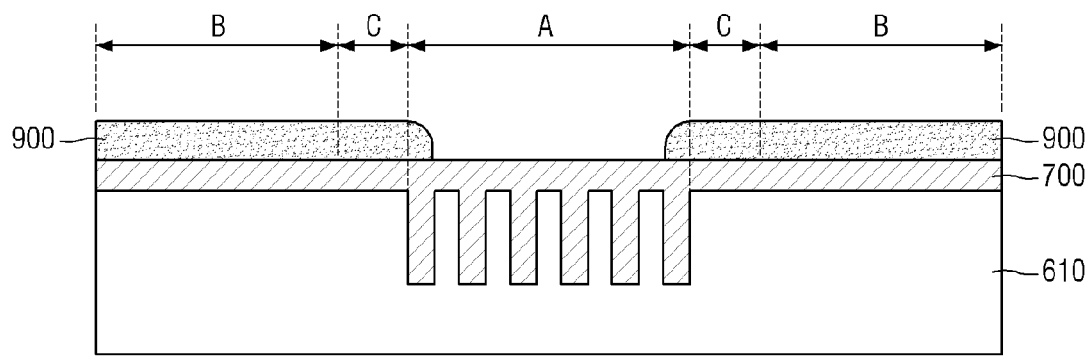

Referring to FIG. 24, a second resist layer 900 is formed on the second sacrificial layer 750. The second resist layer 900 may be formed to overlap the second area B as illustrated in FIG. 24, and may further overlap the boundary area C in consideration of margins. The second resist layer 900 may also be formed to overlap the second area B, the boundary area C, and the first area A. The second resist layer 900 may include photocurable resin or thermoplastic resin.

Figure 25:
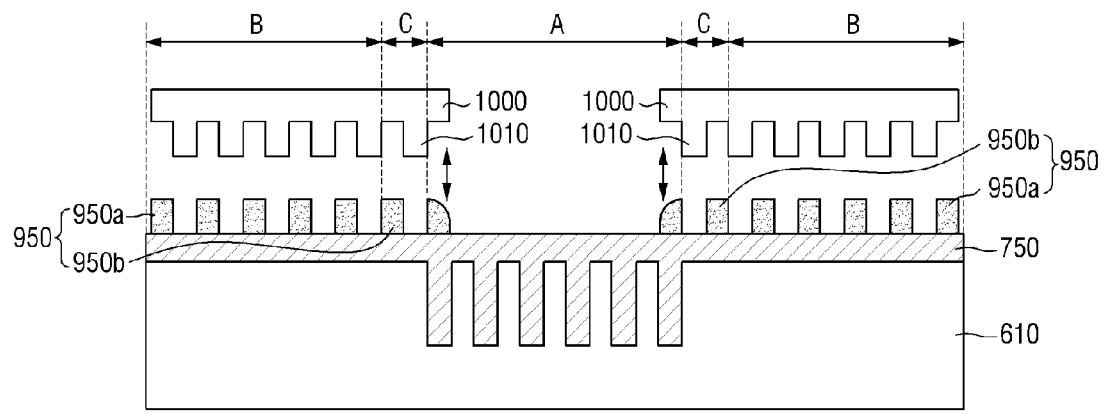

Referring to FIG. 25, a mold 1000 having transfer patterns 1010 is prepared. The shape of transfer patterns 1010 of the mold 1000 is formed on the second resist layer 900 by an imprinting process, thereby forming second resist patterns 950. A detailed description of the imprinting process is substantially similar to the imprinting process described above, and thus, repeated descriptions thereof will be omitted. As described above, the second resist layer 900 may be formed to overlap the second area B and a portion of the boundary area C in consideration of margins. Accordingly, the second resist patterns 950 may include first portions 950a overlapping the second area B and second portions 950b overlapping the boundary area C.

The mold 1000 may be substantially identical to the mold 1000 used in the process of forming the first resist patterns 850 (see FIG. 18). More particularly, the imprinting process may be performed by repeatedly transferring the shape of the transfer patterns 1010 of a relatively small mold 1000, for example, by using a step-and-repeat method. Accordingly, a large area may be patterned using the relatively small mold 1000.

Figure 26:
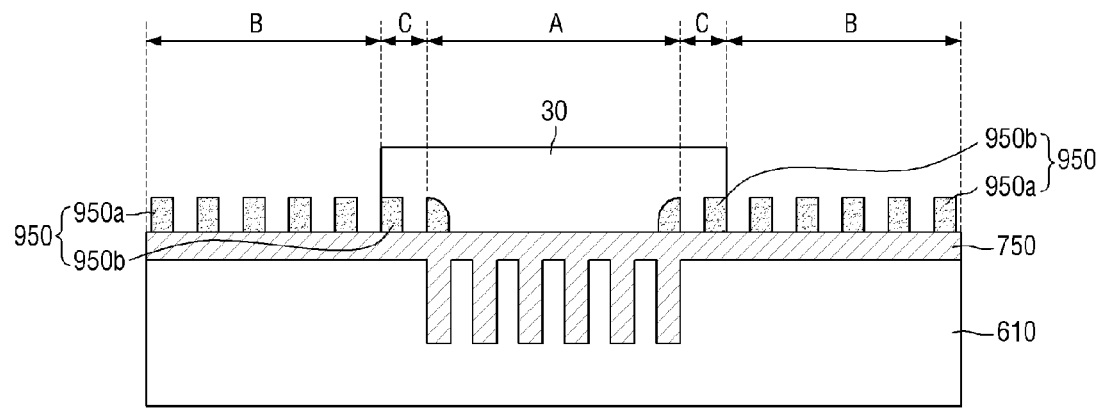

Referring to FIG. 26, a second cover pattern 30 is formed on the second sacrificial layer 750 to cover a portion of the second resist patterns 950. The method of forming the second cover pattern 30 may be substantially similar to the method of forming the first cover pattern 20 (see FIG. 19). That is, the second cover pattern 30 may be formed by coating a photoresist on the second sacrificial layer 750 to cover the second resist patterns 950, and then exposing and developing the photoresist.

The second cover pattern 30 may cover the second portion 950b of the second resist patterns 950 which overlaps the boundary area C, and the second over pattern 30 may not cover the first portions 950a which overlap the second area B. Alternatively, when the second resist patterns 950 are formed to cover the second area B, the boundary area C, and a portion of the first area A, the second cover pattern may 30 also cover the second resist patterns 950 overlapping the first area A.

Figure 27:
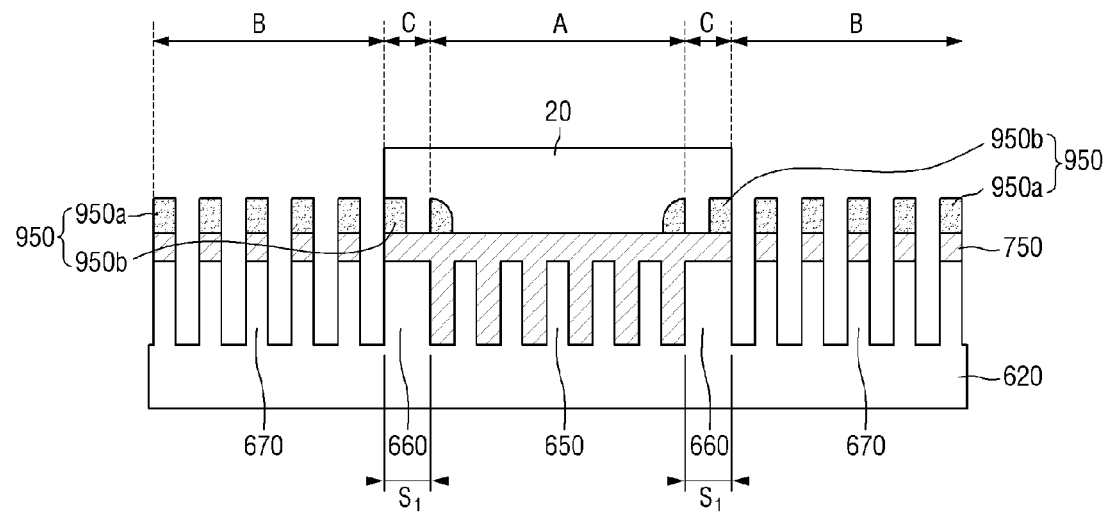

Referring to FIG. 27, the base part 600 is patterned using the second resist patterns 950 and the second cover pattern 30 as a mask. As a result, second fine patterns 670 formed by patterning the second area B of the base part 600 may be disposed under the second resist patterns 950. In this manner, the boundary area C and the first area A of the base part 600 covered by the second cover pattern 30 may not be patterned. In addition, the second sacrificial layer 750 may remain between the second resist patterns 950 and the second fine patterns 670, and between the second cover pattern 30 and the base part 600. The second area B of the base part 600 may be patterned by a dry-etching process using an etching gas. The etching gas may be substantially identical or similar to those described above, and thus, a repeated description thereof is omitted.

Referring back to FIG. 21, the second sacrificial layer 750 may be separated from the base part 600 by treating the second sacrificial layer 750 with a base or hydrogen peroxide. When the second sacrificial layer 750 is separated from the base part 600, the second resist patterns 950 and the second cover pattern 30 disposed on the second sacrificial layer 750 may also be separated from the base part 600. Here, not only the first portions 950a of the second resist patterns 950, but also the second portion 950b may be easily separated from the base part 600, by separating the second sacrificial layer 750 from the base part 600. Therefore, the width ($S_1$) of the boundary area C between the first area A and the second area B may be relatively reduced.

Figure 28:
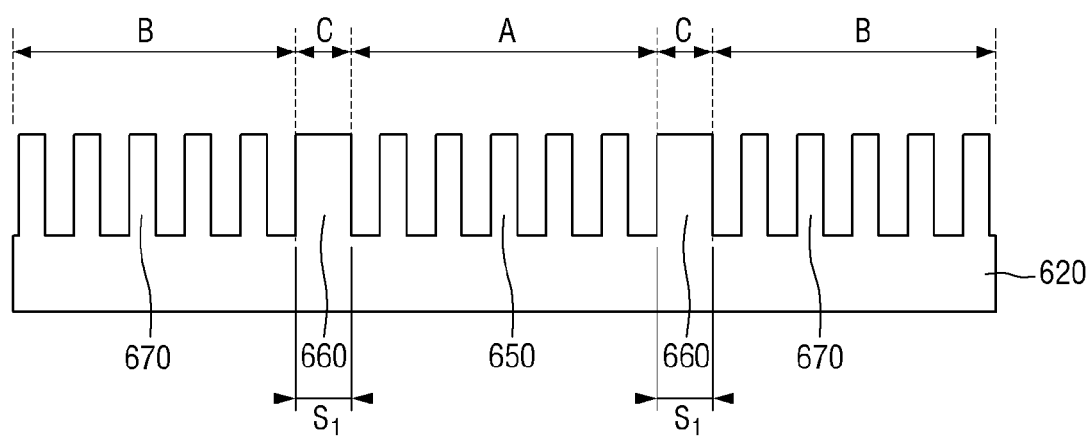

If the base part 600 having the first fine patterns 650 and the second fine patterns 670 is separated from the second sacrificial layer 750 as described above, a fine pattern structure may be obtained as illustrated in FIG. 28. The fine pattern structure manufactured according to an exemplary embodiment may include the first fine patterns 650 formed on the first area A of the base part 600, the second fine patterns 670 formed on the second area B of the base part 600, and a stitch 660 formed on the boundary area C of the base part 600.

An interval between the first fine patterns 650 formed on the first area A and an interval between the second fine patterns 670 formed on the second area B may be the same or different from each other.

The stitch 660 is a boundary portion between the first fine patterns 650 and the second fine patterns 670. If the fine pattern structure is a master mold for pattern transfer, a wire grid polarizer may be formed by transferring the shapes of the patterns of the master mold. In this case, an unnecessary pattern may be formed in a portion of the wire grid polarizer that corresponds to the stitch 660. In particular, if the stitch 660 has a large width $S_1$, the portion of the wire grid polarizer corresponding to the stitch 660 may be observed with the naked eye. In addition, even when the fine pattern structure is a wire grid polarizer, if the stitch 660 has a large width as described above, the portion of the fine pattern structure corresponding to the stitch 660 may also be observed with the naked eye.

When any defects are identified in first and second resist patterns 850 and 950 during formation of the fine pattern structure, a rework process may be performed as described with reference to FIGS. 1 through 12.

According to the exemplary embodiments, resist patterns disposed in the boundary area C may be removed using a sacrificial layer as described above. Therefore, the width $S_1$ of the stitch 660 of the fine pattern structure may be reduced. For example, the width $S_1$ of the stitch 660 may be formed to be less than or greater than the interval of the first fine patterns 650 formed on the first area A and the interval between the second fine patterns 670 formed on the second area B. In addition, since the sacrificial layer includes an adhesive material including a catechol group, the sacrificial layer may be easily removed by treatment with a base or hydrogen peroxide, thereby improving process efficiency.

According to the exemplary embodiments of the present invention, fine patterns may be easily formed over a large area. In addition, a structure of the fine patterns may have a reduced stitch therein. Furthermore, an unwanted defective resist pattern formed in the process of forming fine patterns may be easily reworked.

Although certain exemplary embodiments and implementations have been described herein, other embodiments and modifications will be apparent from this description. Accordingly, the inventive concept is not limited to such exemplary embodiments, but rather to the broader scope of the presented claims and various obvious modifications and equivalent arrangements.

What is claimed is:

1. A method of forming fine patterns, the method comprising:
    preparing a base part comprising a first area, a second area, and a boundary area between the first area and the second area;
    forming a first sacrificial layer comprising a first adhesive material on the first area, the second area, and the boundary area, the first adhesive material comprising a catechol group;
    forming first resist patterns on the first sacrificial layer;
    forming a first cover pattern on the first sacrificial layer and on the first resist patterns to cover a portion of the first resist patterns overlapping the boundary area, the first cover pattern not covering the first resist patterns overlapping the first area;
    forming first fine patterns by patterning the first area using the first resist patterns and the first cover pattern as a mask;
    separating the first sacrificial layer from the base part; and
    forming second fine patterns on the second area of the base part.

2. The method of claim 1, wherein the first adhesive material comprises polydopamine (pDA) or polynorepinephrine (pNor).

3. The method of claim 1, wherein separating the first sacrificial layer from the base part comprises immersing the first sacrificial layer in a basic solution or a hydrogen peroxide solution.

4. The method of claim 3, wherein the basic solution comprises tetramethylammonium hydroxide (TMAH) or potassium hydroxide (KOH).

5. The method of claim 1, wherein the first cover pattern further covers the first sacrificial layer overlapping the second area.

6. The method of claim 1, wherein forming the first resist patterns comprises:
    forming a first resist layer on the first sacrificial layer; and
    transferring the shape of transfer patterns of a mold on the first resist layer through a first imprinting process.

7. The method of claim 1, wherein forming the second fine patterns comprises:
    forming a second sacrificial layer comprising a second adhesive material on the first area, the second area, and the boundary area, the second adhesive material comprising a catechol group;
    forming second resist patterns on the second sacrificial layer;
    forming a second cover pattern on the second sacrificial layer to cover a portion of the second resist patterns overlapping the boundary area, the second cover pattern not covering the second resist patterns overlapping the second area;
    forming second fine patterns by patterning the second area using the second resist patterns and the second cover pattern as a mask; and
    separating the second sacrificial layer from the base part.

8. The method of claim 7, wherein the second adhesive material and the first adhesive material comprise the same material.

9. The method of claim 7, wherein the second cover pattern further covers the second sacrificial layer overlapping the first area.

10. The method of claim 7, wherein:
    forming the first resist patterns comprises:
        forming a first resist layer on the first sacrificial layer; and
        transferring the shape of transfer patterns of a mold on the first resist layer through a first imprinting process; and
    forming the second resist patterns comprises:
        forming a second resist layer on the second sacrificial layer; and
        transferring the shape of the transfer patterns of the mold onto the second resist layer through a second imprinting process.

11. The method of claim 1, wherein a width of a pattern overlapping the boundary area is different from a width of a first fine pattern overlapping the first area.

12. The method of claim 7, wherein a width of a pattern overlapping the boundary area is different from a width of a first fine pattern overlapping the first area and a width of a second fine pattern overlapping the second area.

* * * * *